United States Patent [19]
Cain

[11] Patent Number: 5,285,105
[45] Date of Patent: Feb. 8, 1994

[54] SEMICONDUCTOR DIE PACKAGES HAVING LEAD SUPPORT FRAME

[75] Inventor: Earl S. Cain, Napa, Calif.

[73] Assignee: Tribotech, Napa, Calif.

[21] Appl. No.: 912,030

[22] Filed: Jul. 9, 1992

Related U.S. Application Data

[60] Division of Ser. No. 609,088, Oct. 31, 1990, Pat. No. 5,184,207, which is a continuation of Ser. No. 281,016, Dec. 7, 1988, abandoned.

[51] Int. Cl.$^5$ .............. H01L 23/48; H01L 29/44; H01L 29/52; H01L 29/60
[52] U.S. Cl. .................. 257/672; 257/666; 437/206; 29/741; 29/760; 361/813
[58] Field of Search ............ 257/672, 666, 670; 437/206; 29/741, 760; 361/421

[56] References Cited

U.S. PATENT DOCUMENTS

| | | | |
|---|---|---|---|
| 4,329,642 | 5/1982 | Luthi et al. | 257/672 |
| 4,411,719 | 10/1983 | Lindberg | 437/206 |
| 4,736,236 | 4/1988 | Butt | 257/672 |
| 4,763,409 | 8/1988 | Takekawa et al. | 257/672 |
| 4,772,936 | 9/1988 | Reding et al. | 257/672 |
| 4,859,614 | 8/1989 | Sugahara et al. | 437/206 |
| 5,002,895 | 3/1991 | LeParquier et al. | 437/206 |
| 5,023,202 | 6/1991 | Long et al. | 437/206 |

Primary Examiner—Rolf Hille
Assistant Examiner—David Ostrowski
Attorney, Agent, or Firm—Flehr, Hohbach, Test, Albritton & Herbert

[57] ABSTRACT

A reusable transport and test tape which includes a plurality of insulated conductors adapted to receive and connect to the leads of the lead pack and to position the lead pack for reception of an integrated circuit for bonding of lead pack leads to the contact pads of the integrated circuit and to move the lead pack and integrated circuit into succeeding processing stations where the circuit is tested and packaged.

2 Claims, 7 Drawing Sheets

SEMICONDUCTOR DIE PACKAGES HAVING LEAD SUPPORT FRAME

This is a division of application Ser. No. 07/609,088 filed Oct. 31, 1990, which is now U.S. Pat. No. 5,184,207, which is a continuation of application Ser. No. 281,016 filed Dec. 7, 1988, now abandoned.

FIELD OF THE INVENTION

This invention relates generally to a tape automated lead bonding process for lead attachment to integrated circuit devices and more particularly to a lead package and a reusable transport and test tape for receiving and transporting said lead package during fabrication of packaged integrated circuits.

BACKGROUND OF THE INVENTION

Tape automated bonding is becoming the choice for packaging integrated circuits having high lead count. In this process, thin copper or metal films are etched to define thin film beam conductors which are bonded to the chip contact pads and provide connections to associated printed circuit boards or other circuits. The thin conductive film, in certain instances, has been bonded to an insulating tape to provide testability, transportability and structural rigidity to the thin film conductors.

The format for the thin metal film or thin film layered tape, includes an elongated tape with sprocket holes for indexing the tape as the semiconductor chip is bonded to the thin leads and then advanced to various processing stations for encapsulation, testing and the like. The tapes have widths ranging from 8 to 70 millimeters and are provided on reels or strips. The tape portions which do not form leads for the integrated circuit package are discarded when the integrated circuit package is severed from the tape. Generally, the discarded materials represent a significant cost of packaging.

SUMMARY AND OBJECTS OF THE INVENTION

This invention provides a tape automated bonding process in which the lead package (lead pack) is a separate component secured to a reusable transport tape.

It is an object of the present invention to provide a lead pack for connecting an integrated semiconductor circuit to an associated printed circuit board or the like.

It is another object of the present invention to provide a lead pack for use with a reusable transport tape in an automated bonding system.

It is a further object of the present invention to provide a reusable transport tape for a tape automated bonding system.

It is a further object of the present invention to provide a lead pack in which the leads are embedded in a frame which stabilizes and positions the leads.

It is a further object of the present invention to provide a reusable tape for receiving a lead pack, presenting the lead pack to an integrated circuit for bonding the leads of the lead pack to the integrated circuit and then presenting the lead pack and integrated circuit to succeeding stations for testing and encapsulation.

The foregoing and other objects of the invention are achieved by a reusable transport and test tape which includes a plurality of leads adapted to receive and connect to the leads of the lead pack and to position the lead pack for reception of an integrated circuit for bonding of lead pack leads to the contact pads of the integrated circuit and to move the lead pack and integrated circuit into succeeding processing stations where the circuit is packaged and tested, and then excised.

Further, there is provided a lead pack which includes a rectangular frame of insulating material and a plurality of leads imbedded in said frame and extending inwardly and outwardly therefrom for attachment to an associated integrated circuit and for attachment of the leaded integrated circuit to an associated printed wiring board or like circuit. The insulating frame serves as a dam or sealing means in an encapsulating process. An additional frame stabilizes and positions the outwardly extending ends of the leads.

The foregoing and other objects of the invention will be more clearly understood from the following description when read in connection with the drawings.

DESCRIPTION OF A PREFERRED EMBODIMENT

Figure 1A:
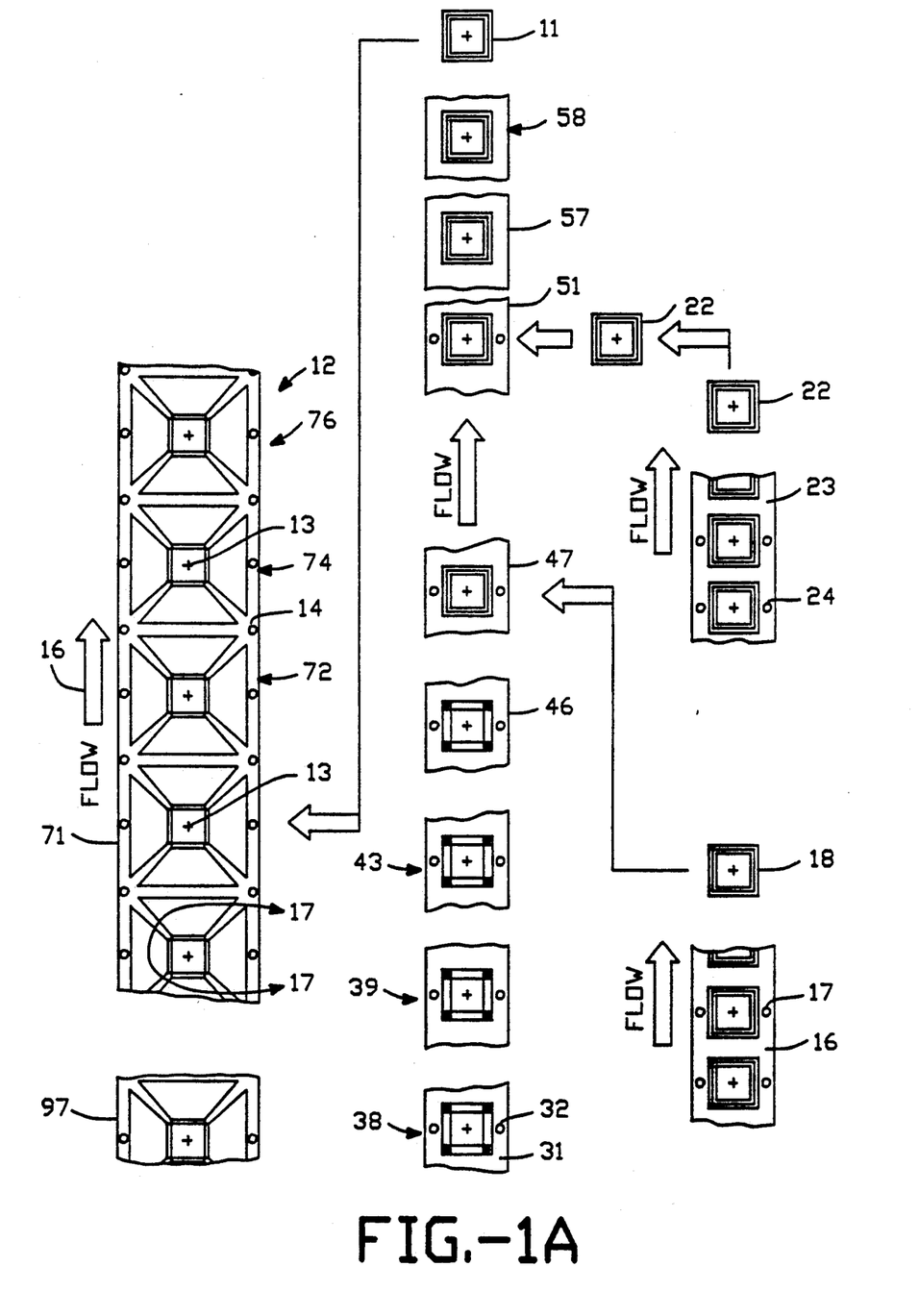
FIGS. 1A and 1B show a flow chart illustrating the formation of a lead pack and transport of the lead pack by the transport and test tape and insertion and testing of an integrated circuit and protective encapsulation thereof.
Figure 1B:
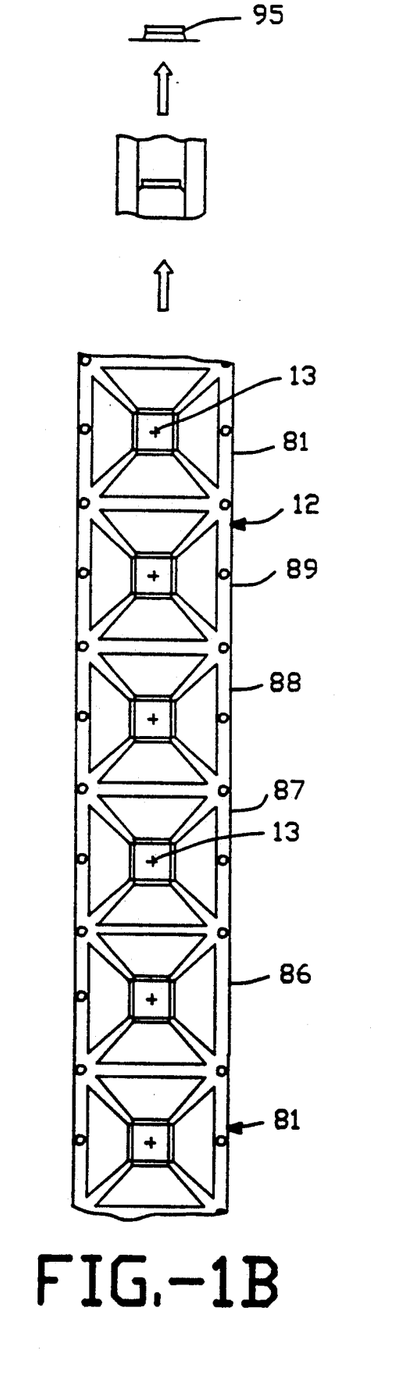

The tape automated bonding processing of this invention employs a novel lead package schematically illustrated at 11 in FIG. 1, to be presently described. Briefly, the lead package includes a frame of insulating material which supports conductors in spaced relationship with one end cantilevered inside the frame and one end extending outwardly. A transport tape 12, FIGS. 1A, 1B, which includes a plurality of windows 13 receives the lead pack. The transport tape includes leads, to be described presently, which splay outwardly from the window to test pads.

The process of the present invention comprises forming the lead pack 11 with its bumped, plated and spaced leads and placing the lead pack 11 within the window 13 with the outwardly extending ends of the leads connecting to the transport tape leads. The transport tape 12 includes sprocket holes 14 which are used to index the tape as it moves in the direction of the arrow 16 to first present the windows for reception of a lead pack 11 then to advance to a station where a semiconductor chip is bonded to the inwardly extending ends of the lead pack leads then to a testing station. The lead pack and chip move to stations where upper and lower housing portions are applied. Each of the operations can be followed by a testing step using the tape test pads to assure that the packaging operation has not altered the electrical properties or relationship between the lead pack and integrated circuit chip. The packaged chip then moves to a burn in station, if such is required, and then to an excise station where the leads are severed from the transport tape and the leads bent to form attachment feet for the packaged semiconductor integrated circuit. The packaged circuit can then be mounted on a printed circuit board or in other electrical circuits.

Figure 2A:
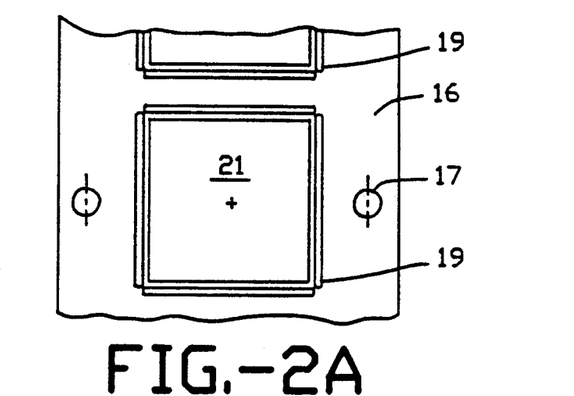
FIG. 2A shows an insulating tape which has been perforated to define a lower lead frame.
Figure 2B:
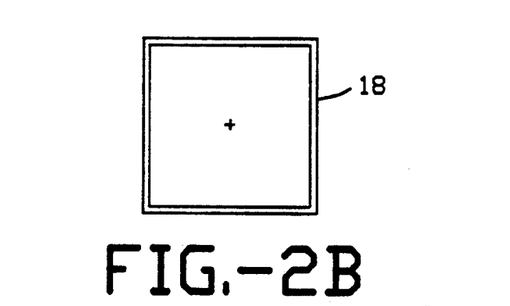
FIG. 2B shows a lower lead frame excised from the tape of FIG. 2A.
Figure 3A:
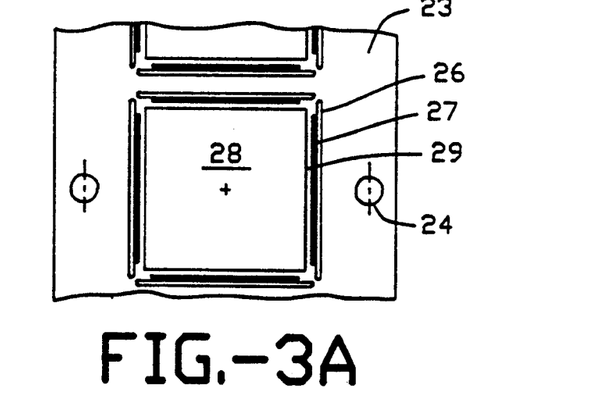
FIG. 3A shows an insulating tape which has been perforated to define an upper lead frame and upper lead support.
Figure 3B:
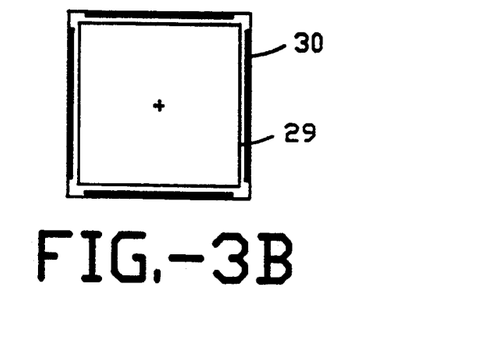
FIG. 3B shows the upper lead frame and upper lead support excised from the tape of FIG. 3A.

The lead pack lead support frame includes upper and lower frame portions adhered to one another to embed the leads. Referring to FIG. 1A the lower frame portion is formed from an insulating material 16 which includes sprocket openings 17 and is moved sequentially through processing stations. For example, the tape may be a polyimide, acrylic, polycarbonate, polyester, epoxy or other thermally responsive insulating and adhesive material. A frame 18 is formed by first forming windows 19 in the tape, FIG. 2A, and thereafter excising the central portion 21 to form the frame 18. The upper frame portion 22 is formed from a similar insulating material 23 of the same type as the tape 16. The tape 23 includes sprocket openings 24 for indexing. Referring to FIG. 3A, the tape is perforated to form windows 26 and 27 and then the central portion 28 is excised to leave a frame having an inner frame portion 29 to mate with the lower frame portion 18 and an outer portion 30 which is adapted to engage and support the ends of the leads as will be presently described.

Figure 4:
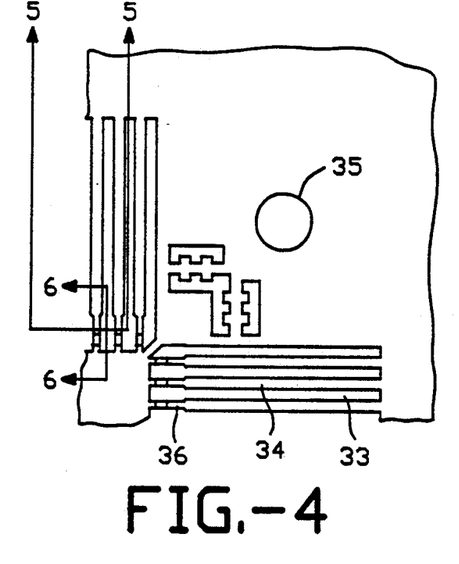
FIG. 4 shows a portion of a thin metal film such as a copper perforated to define leads.
Figure 5:
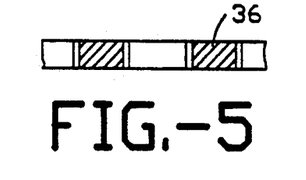
FIG. 5 is a sectional view taken along the line 5—5 of FIG. 4.
Figure 6:
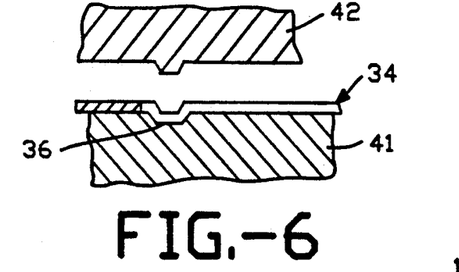
FIG. 6 is a sectional view taken along the line 6—6 in FIG. 4, showing the forming of a lead bump or dimple that will become the inner end of the lead pack lead.
Figure 7:
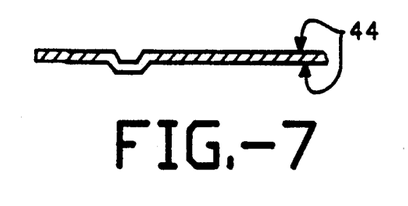
FIG. 7 is a sectional view of a lead with protective plating.
Figure 8:
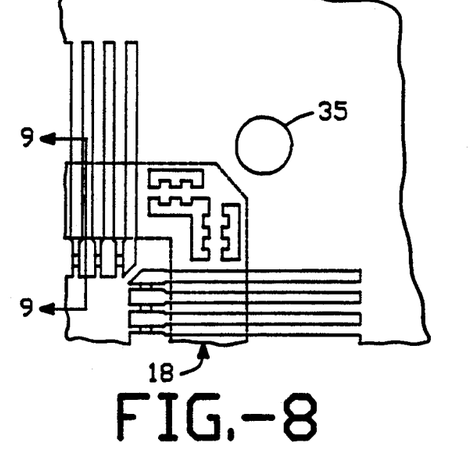
FIG. 8 is a view showing a portion of the perforated metal film with a lower insulating frame attached.
Figure 9:
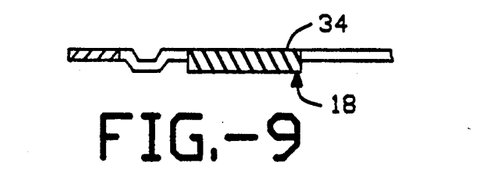
FIG. 9 is a sectional view taken along the line 9—9 of FIG. 8.

The thin metal leads for the lead pack are formed from a thin metal tape (FIG. 1A), such as a copper tape, 31 which includes sprocket holes 32 for indexing the tape as it passes various stations. An enlarged portion of the tape 31 is shown in FIG. 4. The tape is first punched, perforated or etched to form a plurality of windows 33 and indexing holes 35 diagonally across from one another with one hole being round, as shown, and the other (not shown) being a rectangular slot. The windows 33 define therebetween elongated leads 34 which have a narrow end 36. The enlarged sectional view of FIG. 5 shows the beam leads. This first step is schematically illustrated at 38, FIG. 1A. The tape is then advanced and indexed to a second station 39 where the perforated foil is presented to a forming die which forms bumps, or dimples, in the narrow end 36 of the leads. As shown in FIG. 6, the die comprises a lower die portion 41 which receives the leads and a forming punch 42 which deforms the leads into the lower die to form dimples which are spaced from the sides of the lead. The perforated punched tape is then moved to a station 43 where the leads are plated with gold, tin or other material 44 (FIG. 7). The tape is then advanced to station 46 where it is heated. At the next stage 47 the lower thermal adhesive frame 18 is applied. Referring to FIGS. 8 and 9, the frame 18 is positioned to allow the portions 36 of the beam leads 34 to project beyond the frame 18. Referring to FIG. 12, the lead frame 18 is brought into registry with the beam leads 34 with a vacuum chuck 48. The heated beam leads 34 and frame 18 are pressed towards one another by moving the vacuum chuck 48 downwardly to bring the thermal adhesive into contact with the beam leads and to further advance and press the frame 18 until it is flush with the lower surface 48 of the beam leads. The successive steps just described are shown in FIGS. 12B-12F.

Figure 10:
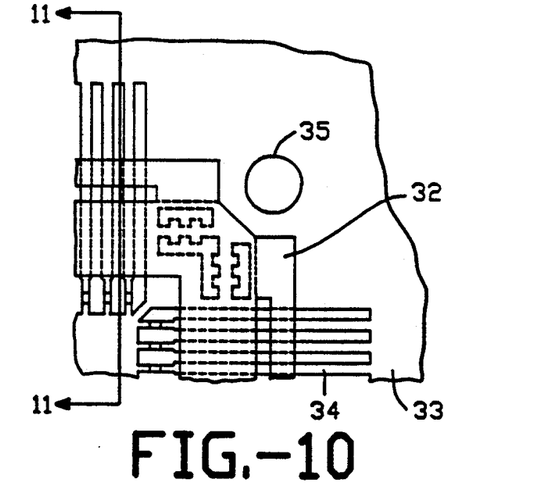
FIG. 10 is a view showing a portion of perforated metal film with both the lower and the upper insulating frame attached.
Figure 11:
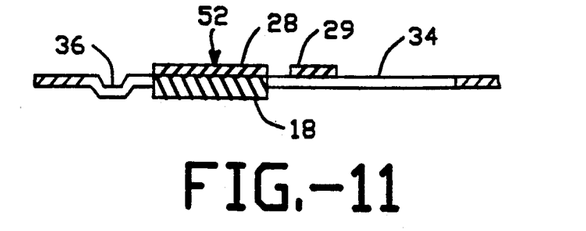
FIG. 11 is a sectional view taken along line 11—11 of FIG. 10.
Figure 12A:
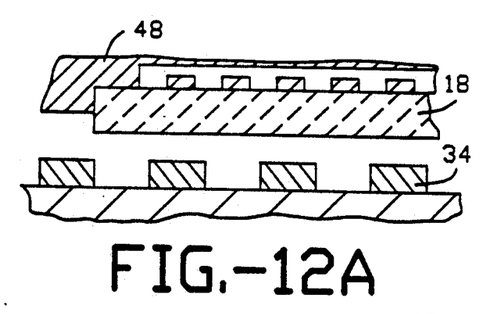
FIGS. 12A-12F show the steps in imbedding the leads in the lower insulating frame.
Figure 12B:
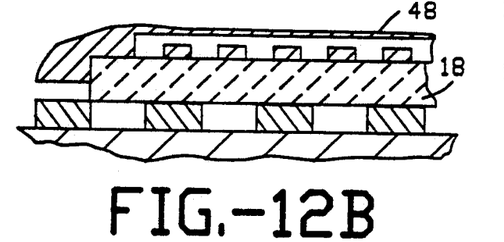
Figure 12C:
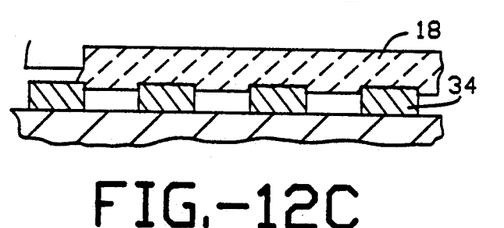
Figure 12D:
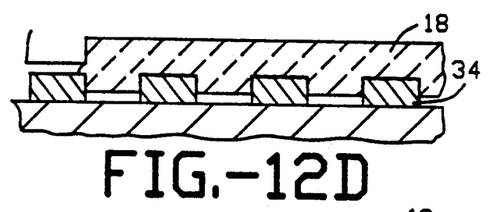
Figure 12E:
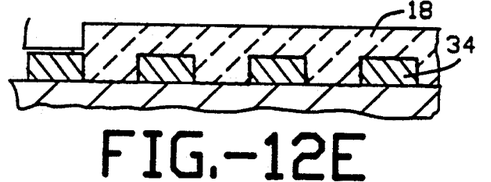
Figure 12F:
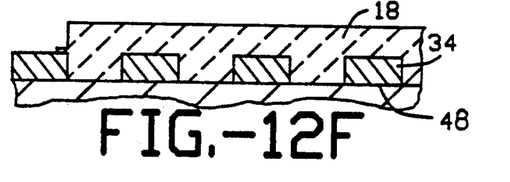

The foil tape is then advanced to the next station 51 where the upper lead pack frame 22 is registered with the lower lead pack frame, FIGS. 10-11, and is pressed downwardly as indicated by the arrow 52, FIG. 11. This adheres the two frames together and imbeds the beam leads 34 between them. The lead support 29 is shown engaging the leads at a location spaced from the frame.

Figure 13:
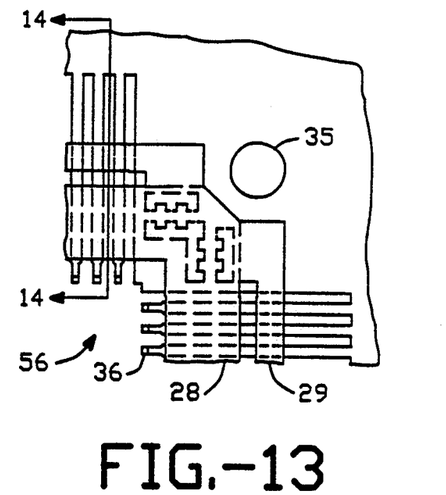
FIG. 13 shows the perforated metal film with the center portion excised to provide cantilevered and plated lead portions.
Figure 14:
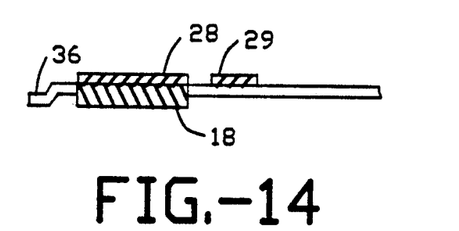
FIG. 14 is a sectional view taken along the line 14—14 of FIG. 13.
Figure 15:
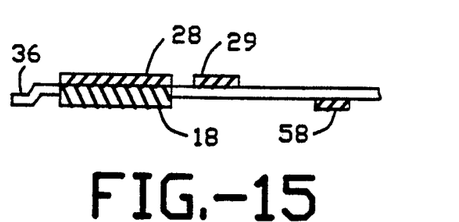
FIG. 15 is a sectional view showing the lead of FIG. 14 with a conductive adhesive applied.
Figure 16:
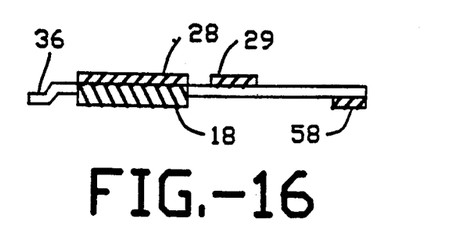
FIG. 16 is a sectional view showing outer leads excised from the perforated metal film to thereby form a lead pack.

Next, the metal foil is removed from the center 56, FIG. 13, to leave the beam lead ends 36 cantilevered inwardly from the lead frame formed by the upper and lower lead frame portions 18 and 28 with the dimpled region spaced from the end of the lead as shown in FIG. 14. The next step 57, FIG. 1A and FIG. 15, is to apply an electrically conductive thermal adhesive 58 to the lower side of the outwardly extending lead portions 34 and thereafter severing the leads from the foil tape, step 59, FIG. 1A, to provide a lead pack comprising a frame with inwardly cantilevered lead portions 36 and outwardly extending lead portions 34 with an adhesive 58 on the underside of the outer end of the lead and a lead support and separator 29 as shown in FIG. 16.

Figure 17:
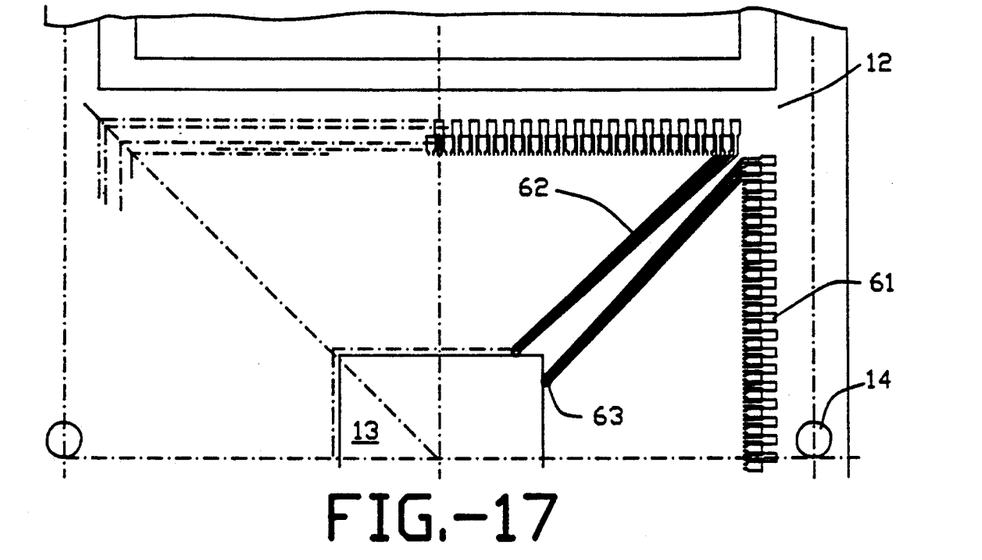
FIG. 17 is an enlarged view of a portion of the tape transport illustrating the conductive pattern between the center window and the outer test pads.

As previously described and in accordance with the invention, a reusable transport tape 12 is used to transport the lead pack 11 and associated integrated circuit chip for processing. Referring to FIG. 1A, the transport tape 12 includes a plurality of spaced windows 13 which are indexed by sprocket holes 14. The enlarged view of a portion 17—17 of the tape is shown in FIG. 17. The tape includes a plurality of test pads 61 connected by leads or lines 62 to lead ends 63 which extend to and are adjacent the edge of the window 13. If the transport tape is of electrical insulating material such as mylar or polyamide, then the pads 61, leads 62, and ends 63 are formed by photoetching a metal film carried by the tape. In the preferred embodiment, the tape is a stainless steel tape. The tape surface is provided with a nonconductive adhesive layer to which a metal film is applied and photo etched to define the leads.

Figure 18:
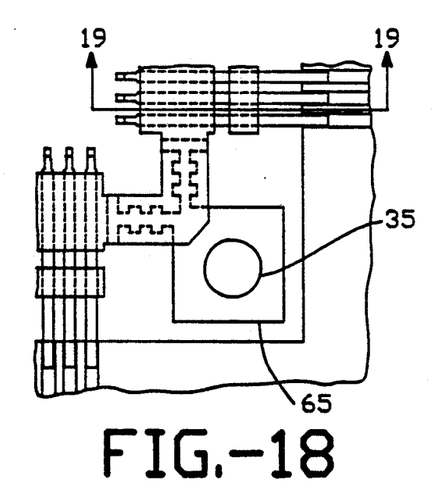
FIG. 18 shows the lead pack with the leads secured to the tape transport conductors with a conductive adhesive.
Figure 19:
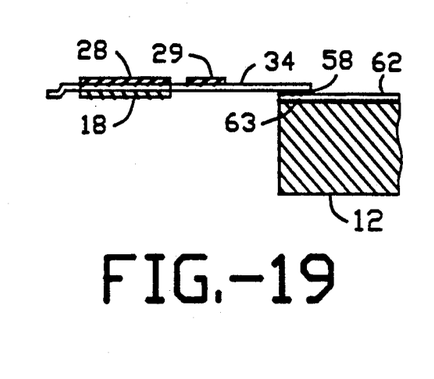
FIG. 19 is a sectional view taken along the line 19—19 of FIG. 18 showing the connection of the lead pack leads to the transport tape leads.
Figure 20:
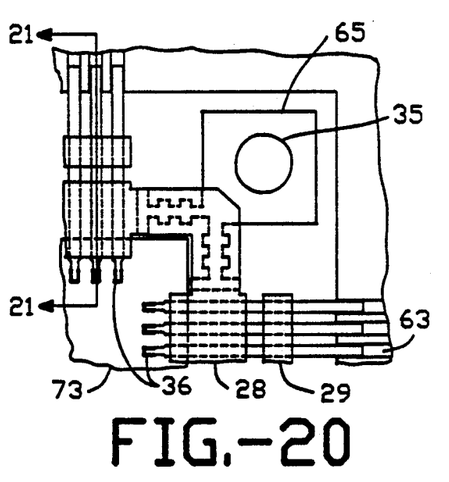
FIG. 20 is a partial view showing the cantilevered lead pack inner leads attached to a semiconductor chip.
Figure 21:
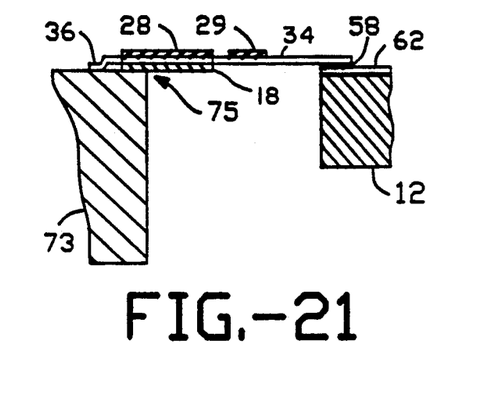
FIG. 21 is a sectional view taken along the line 21—21 of FIG. 20 showing the connection of a bumped or dimpled inner lead to a chip contact pad.
Figure 22:
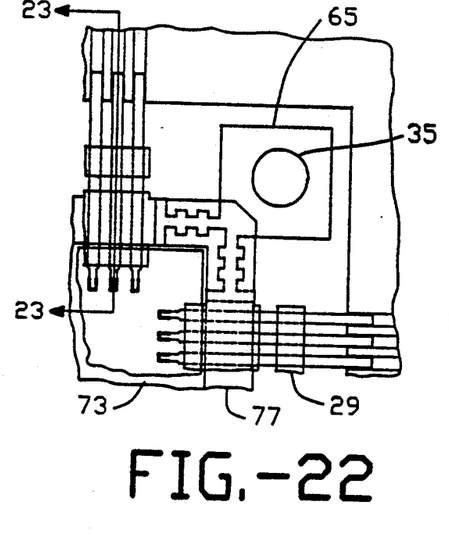
FIG. 22 shows a lower package body attached to the lead pack frame.
Figure 23:
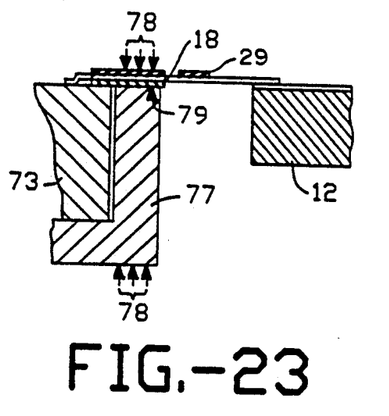
FIG. 23 is a sectional view taken along the line 23—23 of FIG. 22 showing the lower housing.
Figure 24:
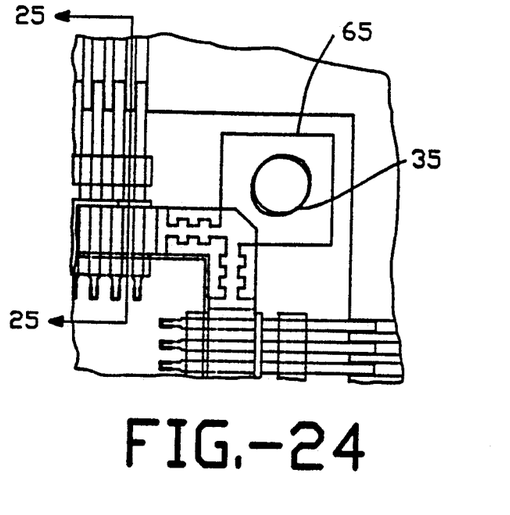
FIG. 24 is a view showing the application of the upper housing body to the lead pack frame.
Figure 25:
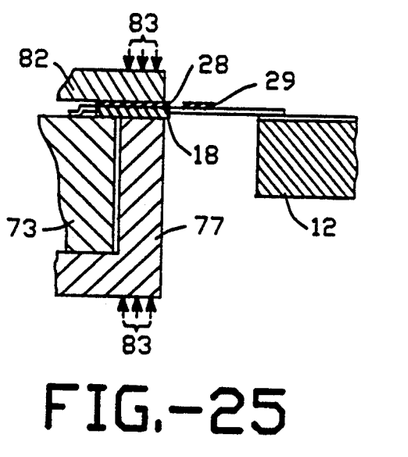
FIG. 25 is a sectional view taken along the line 25—25 of FIG. 24 showing the upper housing portion.
Figure 26:
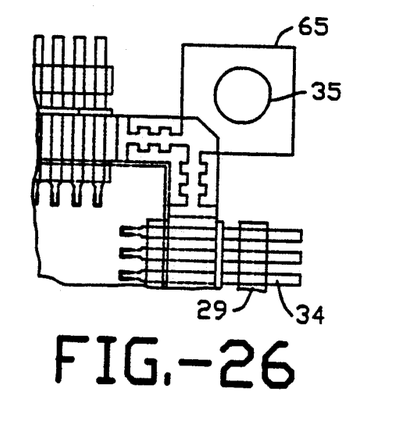
FIG. 26 shows the leads severed from the transport tape.
Figure 27:
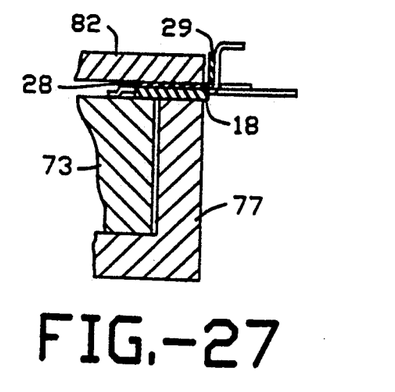
FIG. 27 shows bending of the outwardly extending lead portions to form feet for attachment to an associated circuit.
Figure 28:
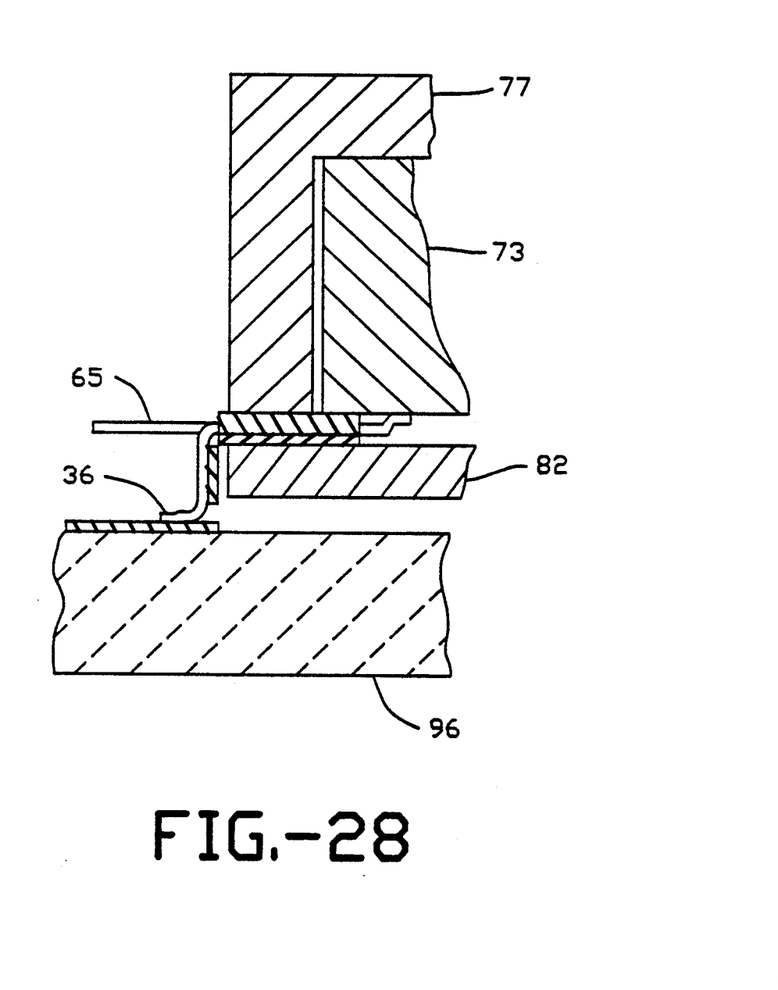
FIG. 28 is an enlarged view of a portion of a packaged semiconductor device attached to a printed wiring board.

In accordance with the invention, the lead pack is placed in the window 13, FIGS. 18 and 19, with the leads 34 overlapping the transport leads 63 and the conductive thermal adhesive 58 therebetween and the assembly heated to thereby form electrical contact between the ends of the leads 34 and the ends 63 of leads 62 connected to test pads 61. The insertion of the lead pack in the window and connection of the leads to transport leads is schematically illustrated by the station 71. The lead pack is accurately located and oriented by engaging the locating holes 35 in the lead frame tab 65. The next station 72 is where the cantilevered inner ends 36 of the lead pack leads are bonded to the bonding pads of an associated chip 73, FIGS. 20 and 21. It is noted that the lower lead frame portion 18 serves to guard against shorting of the lead 34 to the edge 75 of the semiconductor wafer 73. The end 36 of the lead may be bonded to the die by thermal compression bonding, thermosonic bonding or ultrasonic bonding, or by other suitable bonding techniques with either single point or gang bonding tools. The bonded assembly is then advanced to the next station 74 where electrical contact is made to the test pads to electrically test semiconductor integrated circuit 73 attached to the inner leads 36. If the circuit 73 is satisfactorily bonded and tested as being operable, the circuit can be packaged by molding a housing on the circuit using the frame as the mold dam, station 76. Alternatively, the packaging can comprise a lower preformed packaged body 77, attached by thermal compression bonding as illustrated in FIGS. 22 and 23. The lower housing 77 is placed over the semiconductor die 73 and is pressed against lower frame portion 18 while thermal energy is applied to melt the adhesive interface and to provide a seal. Alternatively, the adhesive may adhere solely by pressure. The arrows 78 indicate pressure applied to provide a bonding force for the thermal adhesive bond to take place at the interface 79. At the next station, 81, the upper housing body 82 is applied by thermal compression and/or adhesive bonding. This is illustrated in FIGS. 24 and 25. The pressure is schematically illustrated by the arrows 83. The tab 65 and hole and slot 35 are used in the foregoing steps to maintain alignment of the housing with respect to the leads by identifying the center and angularity of the lead pattern. This same tab 65 and hole and slot 35 are used to locate the lead pack on the transport tape and again in the excise and lead form die assembly and again in application to the printed wiring board as an accurate placement means in match-up with a mating lead pattern or forming die, each adaptation being described hereafter. In the next station, 86, the encapsulation can be tested for seal and mechanical integrity followed by burn-in of the device at station 87, if desired. Final electric testing is performed at station 88 marking and coding the device package at station 89. At station 91 the package is excised by cutting the leads 34 adjacent the leads 63 as shown in FIG. 26. This step is also accurately located by the hole and slot 35. Thereafter, the extending lead portions are bent as shown in FIG. 27 to form feet 92, with the leads supported and spaced from one another by the frame 29. In FIG. 28, a packaged device 95, formed in accordance with the present invention, is shown attached to a printed wiring board 96. The hole and slot 35 in tab 65 can be used for orientation. The transport tape lead ends 63 can be cleaned to remove the electronically conductive adhesive and severed lead ends so that the transport and test tape can be reused. The cleaning station is illustrated at 97.

Thus, there has been provided a novel lead pack having a plurality of spaced, dimpled leads particularly useful for use with a novel reusable transport and test tape.

What is claimed:

1. A reusable lead pack transport tape comprising:
   an elongated metal tape;
   a layer of insulating material bonded to one face of said tape;
   windows in said metal tape and insulating layer spaced along said tape for receiving a lead pack of the type having outwardly extending leads;
   a plurality of thin test pads bonded to and carried by said insulating layer spaced outwardly away from said windows and spaced in relation to one another; and
   a plurality of thin spaced leads bonded to and carried on said insulating layer, spaced in relation to one another and splayed outwardly away from the edge of said windows to the test pads, the window to receive the lead pack with the outwardly extending lead pack leads with the lead pack leads connected to the window end of said thin spaced leads.

2. A reusable lead pack transport tape as in claim 1, in which the elongated metal tape is provided with spaced sprocket holes along its edge to index the tape.

* * * * *